United States Patent
Huang et al.

(10) Patent No.: US 9,814,148 B1
(45) Date of Patent: Nov. 7, 2017

(54) WEARABLE ELECTRONIC DEVICE

(71) Applicant: Primax Electronics Ltd., Taipei (TW)

(72) Inventors: Wei-Yung Huang, Taipei (TW); Chen-Hsuan Hsu, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 15/266,940

(22) Filed: Sep. 15, 2016

(30) Foreign Application Priority Data

Jun. 17, 2016 (TW) .............................. 105119149 A

(51) Int. Cl.
*G06F 1/16* (2006.01)
*H05K 5/00* (2006.01)
*H05K 1/11* (2006.01)

(52) U.S. Cl.
CPC ............. *H05K 5/0086* (2013.01); *H05K 1/11* (2013.01); *H05K 5/0004* (2013.01)

(58) Field of Classification Search
CPC ............................... H05K 5/0086; G06F 1/163
See application file for complete search history.

(56) References Cited

U.S. PATENT DOCUMENTS

| | | | | |
|---|---|---|---|---|
| 5,285,398 A * | 2/1994 | Janik | ....................... | G06F 1/163 361/679.03 |
| 2004/0093363 A1* | 5/2004 | Cargin, Jr. | ............ | G06F 1/1613 708/131 |
| 2015/0338879 A1* | 11/2015 | Hiramoto | ................. | G06F 1/163 361/679.03 |
| 2015/0346766 A1* | 12/2015 | Justice | ..................... | G06F 1/163 361/679.03 |
| 2015/0346767 A1* | 12/2015 | Yang | ...................... | G06F 1/1637 361/679.03 |
| 2015/0349457 A1* | 12/2015 | Shariff | ..................... | H01R 24/20 439/37 |
| 2016/0026215 A1* | 1/2016 | Armstrong | .............. | G06F 1/163 320/103 |
| 2016/0048159 A1* | 2/2016 | McCormack | ........... | G06F 1/163 361/679.03 |
| 2016/0070234 A1* | 3/2016 | Lee | ....................... | A44C 5/0007 368/282 |
| 2016/0116940 A1* | 4/2016 | Jones | ..................... | G06F 1/1698 361/679.03 |
| 2016/0170445 A1* | 6/2016 | Wai | ......................... | G06F 1/163 361/679.03 |

* cited by examiner

*Primary Examiner* — Anthony Q Edwards
(74) *Attorney, Agent, or Firm* — Muncy, Geissler, Olds & Lowe, P.C.

(57) ABSTRACT

A wearable electronic device includes a ring-shaped main body, plural receiving parts, plural circuit boards and a wiring board. The plural receiving parts are disposed within the ring-shaped main body. The plural circuit boards are disposed within the corresponding receiving parts. One of the plural circuit boards corresponds to one receiving part. The wiring board is 111 within the ring-shaped main body and electrically connected with the plural circuit boards. Consequently, the circuit boards are electrically connected with each other through the wiring board.

10 Claims, 7 Drawing Sheets

WEARABLE ELECTRONIC DEVICE

FIELD OF THE INVENTION

The present invention relates to an electronic device, and more particularly to a wearable electronic device.

BACKGROUND OF THE INVENTION

Nowadays, wearable electronic devices such as smart bracelets or sports wristbands are widely used. A process of producing the wearable electronic device will be described as follows. Firstly, plural electronic components are installed on a circuit board. Then, the circuit board with the electronic components is placed within a molding machine. In the molding machine, the circuit board is covered by a rubbery material, and the rubbery material is formed as a ring-shaped structure. Consequently, the smart bracelet or sports wristband with the ring-shaped appearance is fabricated. Due to the ring-shaped appearance, the mart bracelet or sports wristband can be worn on the user's hand.

After the forming process is completed, the circuit board of the conventional smart bracelet, the conventional sports wristband or any comparable wearable electronic device is sealed within the rubbery material. Consequently, the circuit board of the produced wearable electronic device cannot be removed. Moreover, since all of the electronic components are installed on the circuit board after the forming process is completed, the electronic components cannot be replaced. Moreover, after the forming process is completed, the circuit board cannot be connected with another circuit board. Since the wearable electronic device cannot be equipped with an additional circuit board, the functions of the wearable electronic device cannot be expanded. In other words, it is difficult to replace and maintain the electronic components of the wearable electronic device, and the functions of the wearable electronic device are limited. Therefore, there is a need of providing an improved wearable electronic device in order to overcome the above drawbacks.

SUMMARY OF THE INVENTION

For solving the drawbacks of the conventional technology, the present invention provides a wearable electronic device. After the wearable electronic device is produced, the electronic components and the circuit board within the wearable electronic device are replaceable. Moreover, the wearable electronic device can be equipped with plural circuit boards, and the plural circuit boards in the wearable electronic device can be electrically connected with each other. That is, the circuit board and the electronic components can be replaced more easily, and the internal accommodation space can be expanded to accommodate plural circuit boards. Consequently, the space utilization is enhanced, and the functions are expanded.

In accordance with an aspect of the present invention, there is provided a wearable electronic device. The wearable electronic device includes a ring-shaped main body, plural receiving parts, a wiring boar, plural circuit boards and plural bottom covers. The plural receiving parts are separated from each other and disposed within the ring-shaped main body. Each of the plural receiving parts includes an opening. The opening is formed in an inner surface of the ring-shaped main body. The wiring board is integrally formed within the ring-shaped main body and in communication with the plural receiving parts. The plural circuit boards are detachably disposed within the corresponding receiving parts and connected with the wiring board. Moreover, one of the plural circuit boards is aligned with the corresponding opening, and introduced into the corresponding receiving part through the corresponding opening. Each of the plural circuit boards includes a connection part. The connection part is connected with the wiring board. The plural bottom covers are detachably disposed within the ring-shaped main body. Moreover, one of the plural bottom covers is aligned with the corresponding opening to shelter a top side of the corresponding circuit board.

In an embodiment, the ring-shaped main body further includes a bracket, and the bracket is connected with the plural receiving parts. The wiring circuit is attached on a surface of the bracket, and the wiring board is integrally disposed within the ring-shaped main body and in communication with the plural receiving parts.

In an embodiment, the bracket is a flexible bracket.

In an embodiment, each of the plural receiving parts further includes a slot, and the slot is formed in an inner wall of the corresponding receiving part. The wiring board is partially penetrated through the corresponding slots to be in communication with the corresponding receiving parts.

In an embodiment, the wiring board further comprises a connecting wire, and each of the plural circuit boards further includes a signal circuit. The connection part of each circuit board is connected with the connecting wire and the corresponding signal circuit, so that the wiring board and each circuit board are electrically connected with each other.

In an embodiment, the signal circuit of each circuit board is electrically connected with the corresponding connection part.

In an embodiment, the wiring board includes plural connectors corresponding to the respective receiving parts and the respective circuit boards. The connecting wire is extended from the wiring board to the connectors. The connector is detachably connected with the corresponding connection part, so that the connecting wire is electrically connected with the corresponding signal circuit.

In an embodiment, each of the plural circuit boards further includes plural electronic components, and the plural electronic components are installed on the signal circuit to generate plural electric signals. The plural electronic components of the plural circuit boards are electrically connected with each other through the connecting wire of the wiring board.

In an embodiment, each of the plural bottom covers includes plural screws and plural first screw holes, and the corresponding receiving part further includes plural second screw holes. After the screws are penetrated through the corresponding first screw holes and the corresponding second screw holes, the bottom cover is fixed on the ring-shaped main body and the top side of the corresponding circuit board is sheltered by the bottom cover.

In an embodiment, the wiring board is a flexible wiring board.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments and accompanying drawings.

Figure 1:
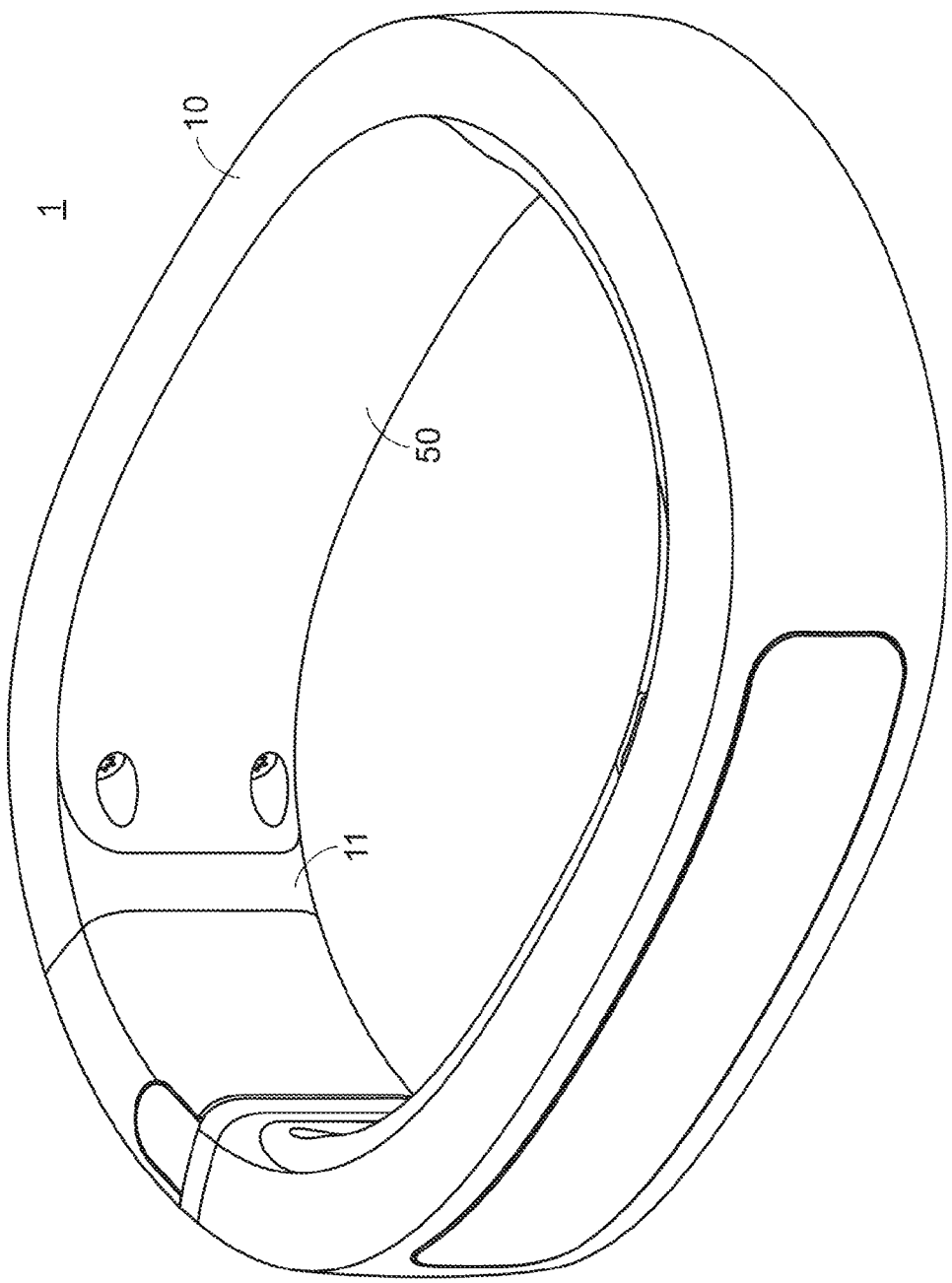
FIG. 1 is a schematic perspective view illustrating a wearable electronic device according to an embodiment of the present invention.
Figure 2:
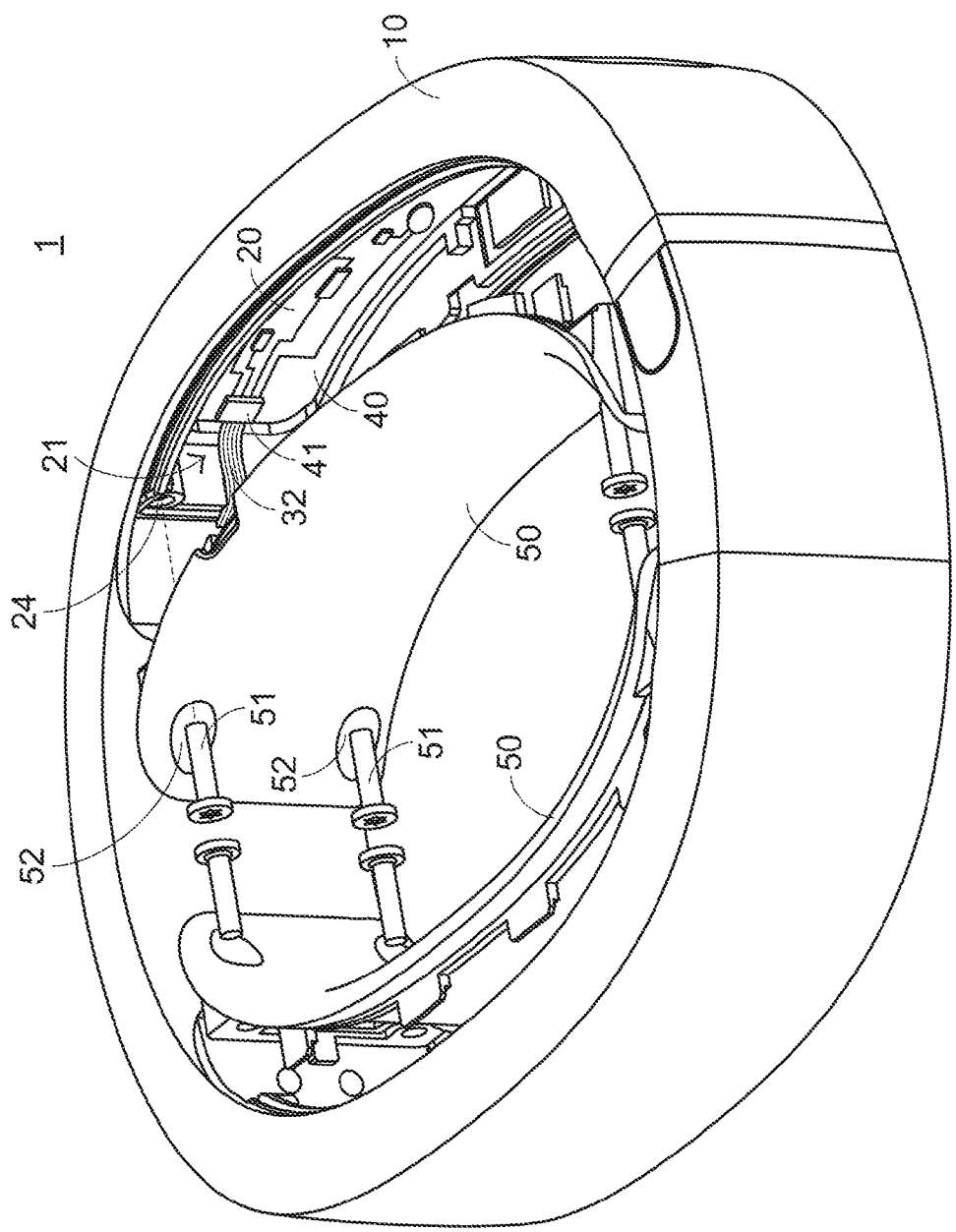
FIG. 2 is a schematic exploded view illustrating the relationship between the bottom cover and the ring-shaped main body of the wearable electronic device according to the embodiment of the present invention.

FIG. 1 is a schematic perspective view illustrating a wearable electronic device according to an embodiment of the present invention. FIG. 2 is a schematic exploded view illustrating the relationship between the bottom cover and the ring-shaped main body of the wearable electronic device according to the embodiment of the present invention. As shown in FIGS. 1 and 2, the wearable electronic device 1 comprises a ring-shaped main body 10, plural receiving parts 20, a wiring board 30 (see FIG. 6), plural circuit boards 40 and plural bottom covers 50. One receiving part 20 corresponds to one circuit board 40 and one bottom cover 50. The combination of one receiving part 20, the corresponding circuit board 40 and the corresponding bottom cover 50 will be described as follows.

The receiving part 20 comprises an opening 21 and plural second screw holes 24. The wiring board 30 (see FIG. 6) comprises plural connectors 32. The circuit board 40 comprises a connection part 41. Moreover, the bottom cover 50 comprises plural screws 51 and plural first screw holes 52. The receiving part 20 is disposed within the ring-shaped main body 10. The opening 21 of the receiving part 20 is formed in an inner surface 11 of the ring-shaped main body 10. The wiring board 30 (see FIG. 6) is integrally formed within the ring-shaped main body 10. Moreover, the space of accommodating the wiring board 30 is in communication with the receiving part 20. A connector 32 of the wiring board 30 (see FIG. 6) corresponds to one receiving part 20 and one circuit board 40. The connector 32 is extended from an inner portion of the ring-shaped main body 10 to the corresponding receiving part 20. The circuit board 40 is detachably accommodated within the receiving part 20 and connected with the wiring board 30. That is, when the connection part 41 of the circuit board 40 is connected with the corresponding connector 32 of the wiring board 30, the corresponding circuit board 40 and the wiring board 30 are electrically connected with each other. The bottom cover 50 is detachably connected with the ring-shaped main body 10. When the bottom cover 50 is connected with the ring-shaped main body 10, the opening 21 of the receiving part 20 and the circuit board 40 are sheltered by the bottom cover 50. The plural screws 51 and the plural first screw holes 52 correspond to the second screw holes 24 of the receiving part 20, respectively. After the screws 51 are penetrated through the corresponding first screw holes 52 and the corresponding second screw holes 24, the bottom cover 50 is fixed on the ring-shaped main body 10.

Figure 3:
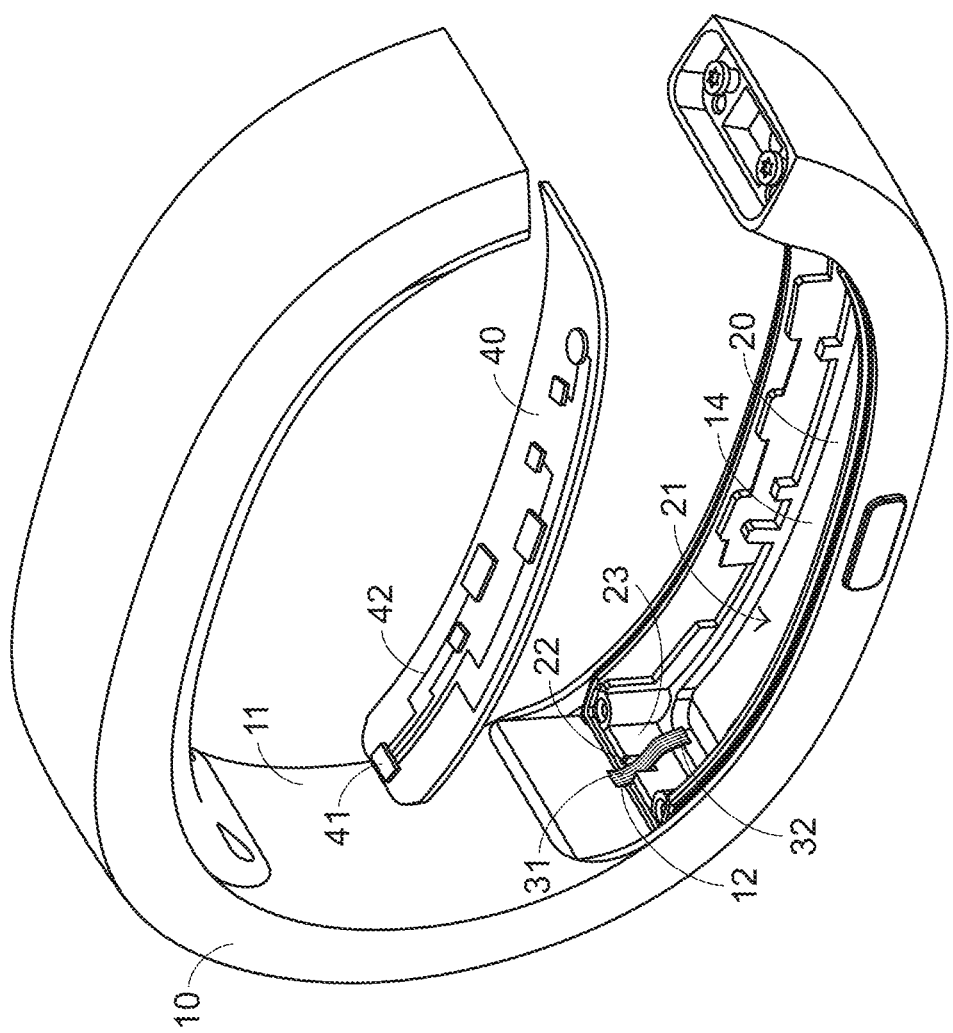
FIG. 3 is a schematic exploded view illustrating the relationship between the circuit board and the ring-shaped main body of the wearable electronic device according to the embodiment of the present invention.
Figure 4:
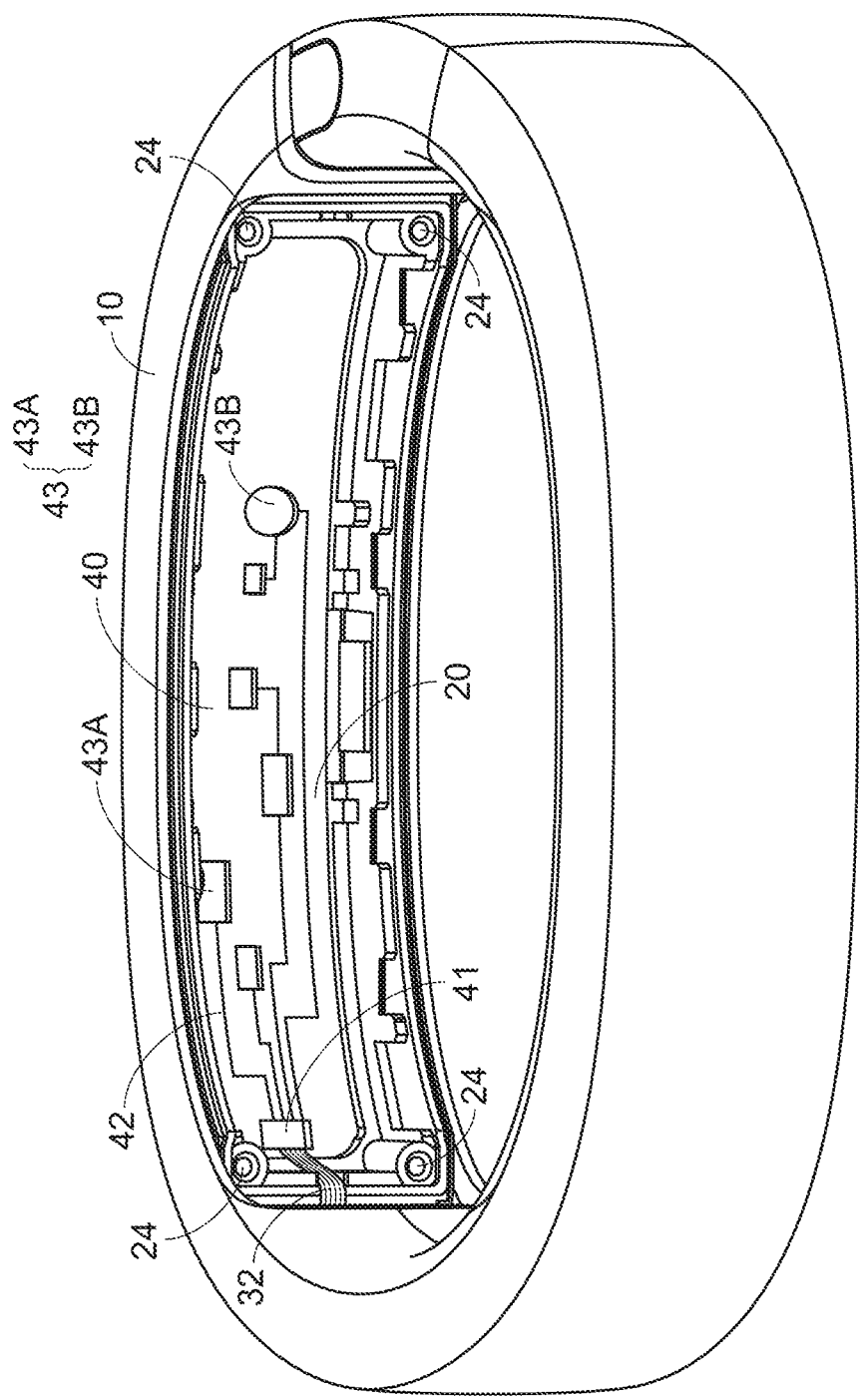
FIG. 4 is a schematic perspective view illustrating the relationship between the circuit board, the ring-shaped main body and the receiving part of the wearable electronic device according to the embodiment of the present invention.

Hereinafter, the structures for installing one circuit board 40 in the ring-shaped main body 10 will be illustrated with reference to FIGS. 3 and 4. FIG. 3 is a schematic exploded view illustrating the relationship between the circuit board and the ring-shaped main body of the wearable electronic device according to the embodiment of the present invention. FIG. 4 is a schematic perspective view illustrating the relationship between the circuit board, the ring-shaped main body and the receiving part of the wearable electronic device according to the embodiment of the present invention. The ring-shaped main body 10 further comprises a perforation 12, a bracket 13 (see FIG. 6) and a fixing frame 14. The receiving part 20 further comprises a slot 22. The slot 22 is formed in an inner wall 23 of the receiving part 20. The wiring board 30 further comprises a connecting wire 31. Moreover, the circuit board 40 further comprises a signal circuit 42 and plural electronic components 43. The perforation 12 is formed in the ring-shaped main body 10. The bracket 13 (see FIG. 6) is disposed within the ring-shaped main body 10 and in communication with the outside of the ring-shaped main body 10 through the perforation 12. The fixing frame 14 is disposed within the receiving part 20 in order to fix the circuit board 40. The wiring board 30 (see FIG. 6) is disposed on the bracket 13 within the ring-shaped main body 10. The connector 32 of the wiring board 30 (see FIG. 6) is penetrated through the perforation 12 of the ring-shaped main body 10 and extended toward the opening 21. Moreover, the connector 32 is introduced into the corresponding receiving part 20 through the slot 22. The connecting wire 31 is extended from the wiring board 30 (see FIG. 6) and toward the connector 32. After the connecting wire 31 is extended outside the ring-shaped main body 10, the connecting wire 31 is introduced into the receiving part 20. The circuit board 40 is placed within the receiving part 20 through the opening 21 and connected with the fixing frame 14. Consequently, the circuit board 40 is fixed in the receiving part 20. The signal circuit 42 of the circuit board 40 is electrically connected with the connection part 41. Moreover, the connection part 41 is detachably connected with the connector 32 of the wiring board 30 (see FIG. 6). Consequently, the signal circuit 42 of the circuit board 40 is electrically connected with the connecting wire 31 of the wiring board 30 (see FIG. 6). The plural electronic components 43 of the circuit board 40 are installed on the signal circuit 42. In an embodiment, the electronic components 43A and 43B are installed on the signal circuit 42. The electronic components 43A and 43B generate different electric signals (not shown). The electric signals are transmitted to the connecting wire 31 through the signal circuit 42.

Figure 5:
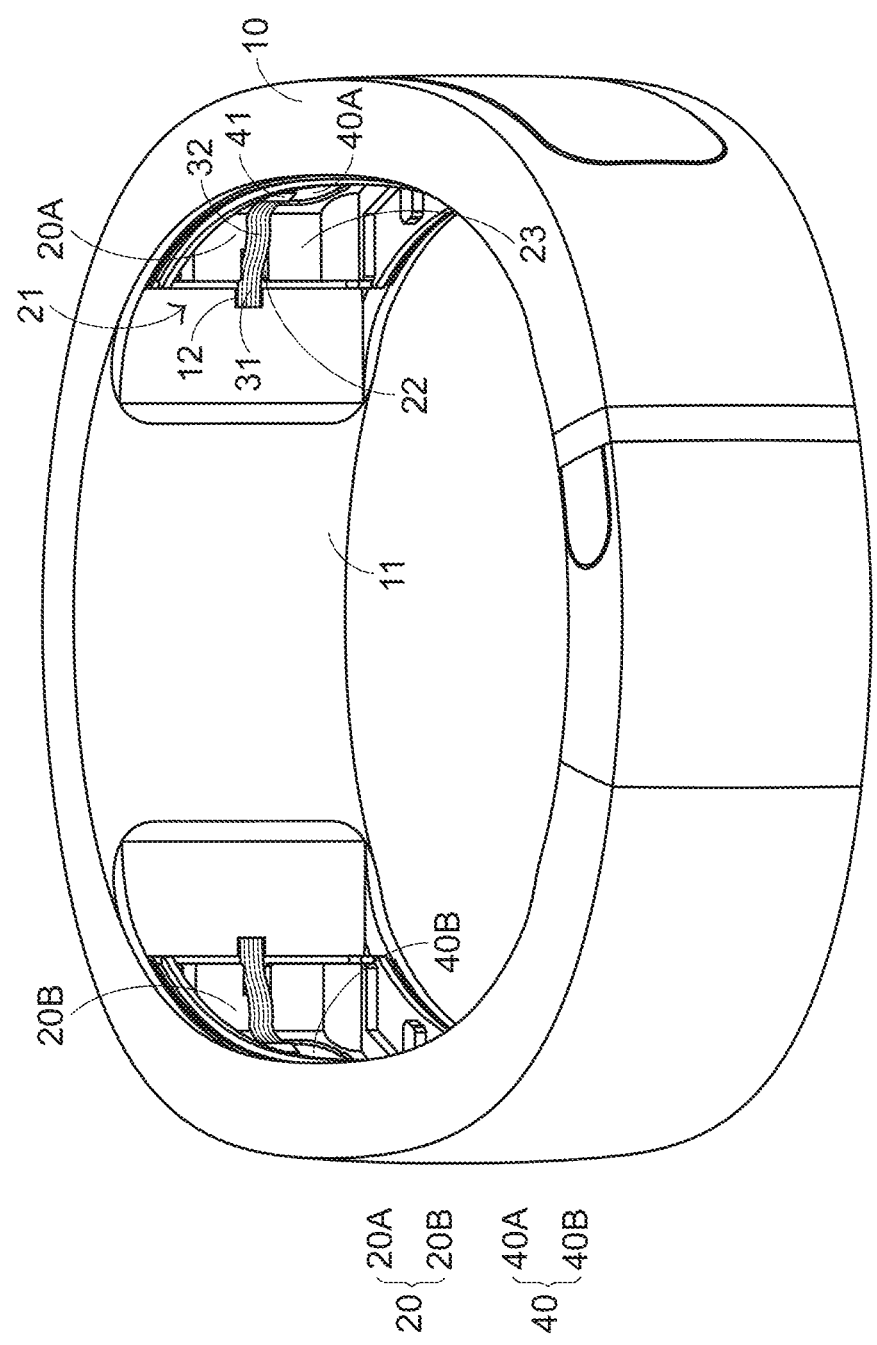
FIG. 5 is a schematic perspective view illustrating the wearable electronic device according to the embodiment of the present invention, in which the bottom covers are not shown.
Figure 6:
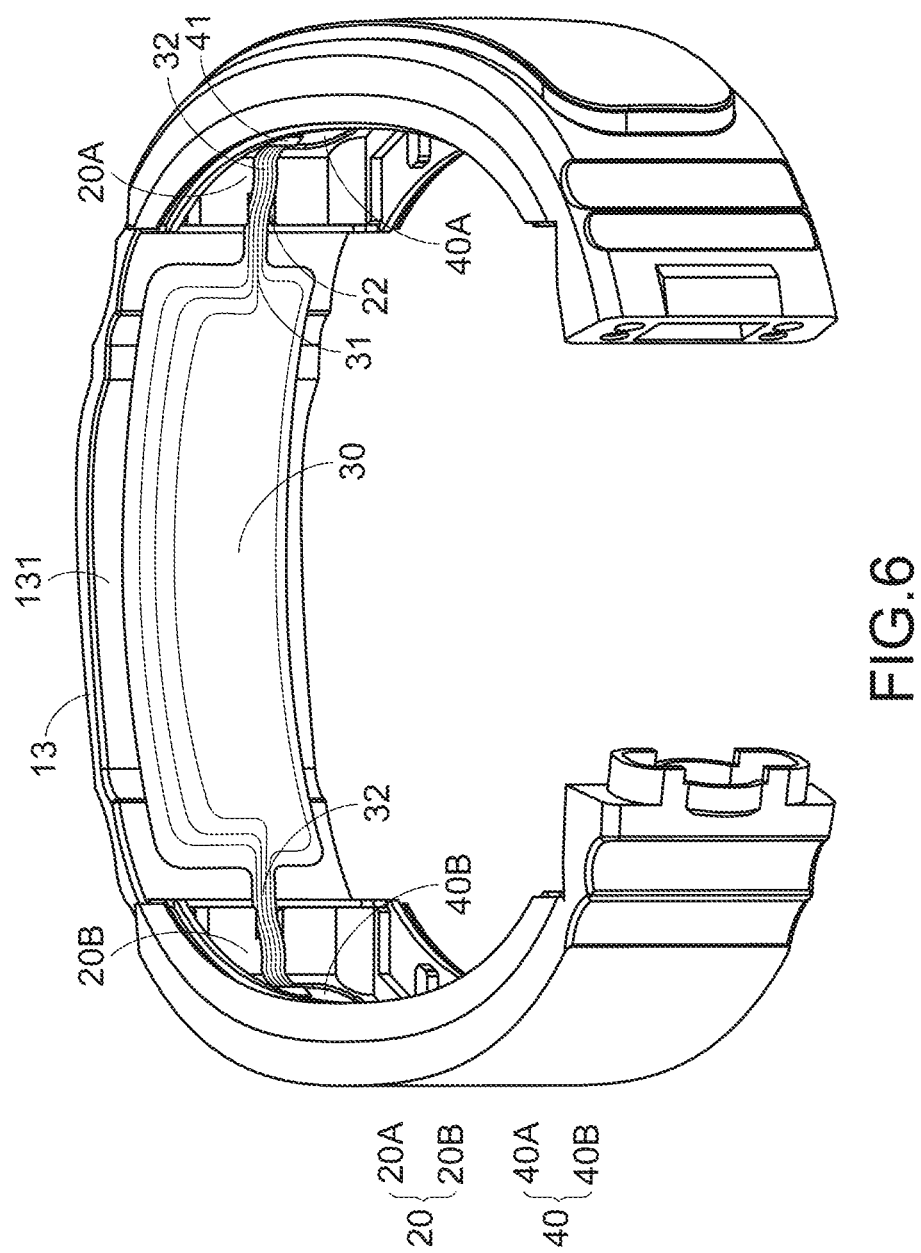
FIG. 6 is a schematic perspective view illustrating the relationship between the receiving part, the bracket and the wiring board of the wearable electronic device according to the embodiment of the present invention.

Hereinafter, the structures for facilitating instilling the wiring board 30 within the ring-shaped main body 10 and connecting the wiring board 30 with the plural circuit boards 40 will be illustrated with reference to FIGS. 5 and 6. FIG. 5 is a schematic perspective view illustrating the wearable electronic device according to the embodiment of the present invention, in which the bottom covers are not shown. FIG. 6 is a schematic perspective view illustrating the relationship between the receiving part, the bracket and the wiring board of the wearable electronic device according to the embodiment of the present invention. As shown in FIG. 6, the bracket 13 is connected with the receiving parts 20A and 20B. The receiving parts 20A and 20B are separated from each other. Preferably, the wiring board 30 and the bracket 13 are integrally disposed within the ring-shaped main body 10 by a molding process. The integral molding process will be described as follows. Firstly, the wiring board 30 is attached on a surface 131 of the bracket 13. Then, the wiring board 30 and the bracket 13 are placed within a mold (not shown). The mold comprises plural molding structures (not shown) for forming the ring-shaped main body 10, the perforation 12 and the receiving parts 20A and 20B. Then, the mold containing the wiring board 30 and the bracket 13 is sent into a molding machine (not shown). Then, a polymeric material such as a rubbery material is injected into the mold (not shown) to cover the wiring board 30 and the bracket 13. After the polymeric material is solidified, the ring-shaped main body 10 is formed, and the receiving parts 20A and 20B is disposed within the ring-shaped main body 10. The bracket 13 within the ring-shaped main body 10 is connected with the receiving parts 20A and 20B. The wiring board 30 is integrally formed within the ring-shaped main body 10. Moreover, the wiring board 30 is partially introduced into the receiving parts 20A and 20B through the perforations 12. After the molding process is completed, the connectors 32 of the wiring board 30 are penetrated through the corresponding perforations 12 of the ring-shaped main body 10 and corresponding slots 22. Consequently, the wiring board 30 is in communication with the receiving parts 20A and 20B. The circuit board 40A is disposed within the receiving part 20A. The circuit board 40B is disposed within the receiving part 20B. The connection parts 41 of the circuit board 40A and the circuit board 40B are connected with the wiring board 30. Consequently, the circuit board 40A and the circuit board 40B are electrically connected with each other through the wiring board 30. Under this circumstance, the electric signals from the plural electronic components 43 can be transmitted between the circuit board 40A and the circuit board 40B.

Figure 7:
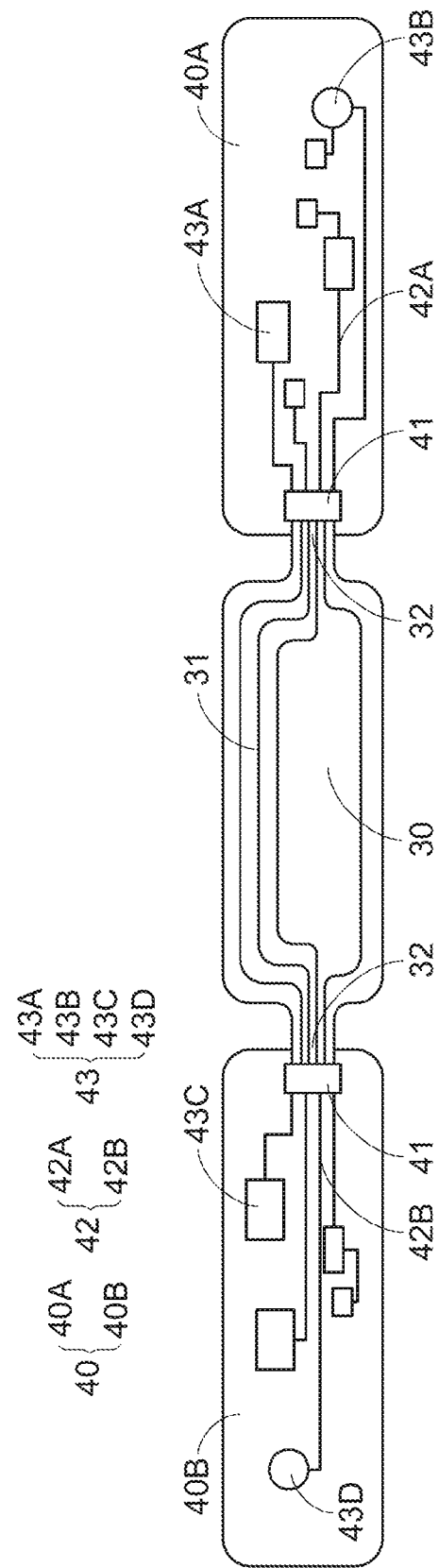
FIG. 7 is a top view illustrating the relationship between the circuit boards and the wiring board of the wearable electronic device according to the embodiment of the present invention.

The structures for connecting the wiring board 30 and the circuit boards 40 will be described as follows. FIG. 7 is a top view illustrating the relationship between the circuit boards and the wiring board of the wearable electronic device according to the embodiment of the present invention. The circuit board 40A and the circuit board 40B are connected with the wiring board 30 through the corresponding connection parts 41. After the electric signals (not shown) from the electronic components 43A and 43B of the circuit board 40A are transmitted to the signal circuit 42A, the electric signals are transmitted to the signal circuit 42B of the circuit board 40B through the connecting wire 31, and the electric signals are transmitted to the electronic components 43C and 43D of the circuit board 40B through the signal circuit 42B. By means of the similar approach, the electronic signals (not shown) from the electronic components 43C and 43D can be transmitted to the electronic components 43A and 43B.

Preferably, the wiring board 30 is a flexible wiring board, and the bracket 13 is a flexible bracket. When the wiring board 30 and the bracket 13 are disposed within the ring-shaped main body 10, the wiring board 30 and the bracket 13 are bendable because of the flexible properties. Consequently, the ring-shaped main body 10 can be easily worn on the user's hand, and the electric connection of the circuits within the ring-shaped main body 10 is achievable.

From the above descriptions, the present invention provides a wearable electronic device. The wearable electronic device can be equipped with plural circuit boards. The plural circuit boards within the wearable electronic device are electrically connected with each other. Moreover, the individual circuit boards and electronic components are replaceable. Consequently, the wearable electronic device can solve the drawbacks of the conventional technologies.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A wearable electronic device, comprising:
a ring-shaped main body;
plural receiving parts separated from each other and disposed within the ring-shaped main body, wherein each of the plural receiving parts comprises an opening, and the opening is formed in an inner surface of the ring-shaped main body;
a wiring board integrally formed within the ring-shaped main body and in communication with the plural receiving parts;
plural circuit boards detachably disposed within the corresponding receiving parts and connected with the wiring board, wherein one of the plural circuit boards is aligned with the corresponding opening, and introduced into the corresponding receiving part through the corresponding opening, wherein each of the plural circuit boards comprises a connection part, and the connection part is connected with the wiring board; and
plural bottom covers detachably disposed within the ring-shaped main body, wherein one of the plural bottom covers is aligned with the corresponding opening to shelter a top side of the corresponding circuit board.

2. The wearable electronic device according to claim 1, wherein the ring-shaped main body further comprises a bracket, and the bracket is connected with the plural receiving parts, wherein the wiring circuit is attached on a surface of the bracket, and the wiring board is integrally disposed within the ring-shaped main body and in communication with the plural receiving parts.

3. The wearable electronic device according to claim 2, wherein the bracket is a flexible bracket.

4. The wearable electronic device according to claim 1, wherein each of the plural receiving parts further comprises a slot, and the slot is formed in an inner wall of the corresponding receiving part, wherein the wiring board is partially penetrated through the corresponding slots to be in communication with the corresponding receiving parts.

5. The wearable electronic device according to claim 1, wherein the wiring board further comprises a connecting wire, and each of the plural circuit boards further comprises a signal circuit, wherein the connection part of each circuit board is connected with the connecting wire and the corresponding signal circuit, so that the wiring board and each circuit board are electrically connected with each other.

6. The wearable electronic device according to claim 5, wherein the signal circuit of each circuit board is electrically connected with the corresponding connection part.

7. The wearable electronic device according to claim 6, wherein the wiring board comprises plural connectors corresponding to the respective receiving parts and the respective circuit boards, and the connecting wire is extended from the wiring board to the connectors, wherein the connector is detachably connected with the corresponding connection part, so that the connecting wire is electrically connected with the corresponding signal circuit.

8. The wearable electronic device according to claim 5, wherein each of the plural circuit boards further comprises plural electronic components, and the plural electronic components are installed on the signal circuit to generate plural electric signals, wherein the plural electronic components of the plural circuit boards are electrically connected with each other through the connecting wire of the wiring board.

9. The wearable electronic device according to claim 1, wherein each of the plural bottom covers comprises plural screws and plural first screw holes, and the corresponding receiving part further comprises plural second screw holes, wherein after the screws are penetrated through the corresponding first screw holes and the corresponding second screw holes, the bottom cover is fixed on the ring-shaped main body and the top side of the corresponding circuit board is sheltered by the bottom cover.

10. The wearable electronic device according to claim 1, wherein the wiring board is a flexible wiring board.

* * * * *